United States Patent
Kashyap et al.

(10) Patent No.: US 11,098,404 B2
(45) Date of Patent: Aug. 24, 2021

(54) MULTI-STATION CHAMBER LID WITH PRECISE TEMPERATURE AND FLOW CONTROL

(71) Applicant: Applied Materials, Inc., Santa Clara, CA (US)

(72) Inventors: Dhritiman Subha Kashyap, Bangalore (IN); Gopu Krishna, Karnataka (IN); Sanjeev Baluja, Campbell, CA (US); Michael Rice, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/585,463

(22) Filed: Sep. 27, 2019

(65) Prior Publication Data

US 2020/0102651 A1  Apr. 2, 2020

Related U.S. Application Data

(60) Provisional application No. 62/739,194, filed on Sep. 29, 2018.

(51) Int. Cl.
*C23C 16/455* (2006.01)
*H01L 21/67* (2006.01)

(52) U.S. Cl.
CPC .... *C23C 16/45544* (2013.01); *H01L 21/6719* (2013.01)

(58) Field of Classification Search
CPC ........ C23C 16/45544; C23C 16/45519; C23C 16/4408; H01L 21/6719
See application file for complete search history.

(56) References Cited

U.S. PATENT DOCUMENTS

| 7,611,586 | B2 | 11/2009 | Melnik et al. |
| 8,033,769 | B2* | 10/2011 | Gage ................. H01L 21/67742 414/217 |
| 8,033,771 | B1* | 10/2011 | Gage ................. H01L 21/67201 414/217 |
| 9,353,439 | B2* | 5/2016 | Kashyap ........... C23C 16/45525 |
| 9,428,833 | B1* | 8/2016 | Duvall .............. H01J 37/32715 |
| 9,500,610 | B2 | 11/2016 | Kasianowicz et al. |
| 10,741,365 | B2* | 8/2020 | Chandrasekharan ....................... H01J 37/3244 |
| 2004/0020601 | A1* | 2/2004 | Zhao ................... H01L 21/0234 156/345.32 |
| 2007/0218701 | A1* | 9/2007 | Shimizu ............ C23C 16/45551 438/758 |

(Continued)

FOREIGN PATENT DOCUMENTS

| EP | 0258966 B1 | 9/1992 |
| KR | 101021372 B1 | 3/2011 |

(Continued)

OTHER PUBLICATIONS

PCT International Search Report and Written Opinion in PCT/US2019/053430 dated Jan. 17, 2020, 9 pages.

*Primary Examiner* — William Coleman
(74) *Attorney, Agent, or Firm* — Servilla Whitney LLC (57) ABSTRACT

Multi-station process chamber lids comprising a plurality of station openings are described. A station separation purge channel is around the station openings. A plurality of angular purge channels separate station openings from adjacent station openings. A lid support beam can compensate for deflection of the chamber lid body.

17 Claims, 7 Drawing Sheets

(56) References Cited

U.S. PATENT DOCUMENTS

2008/0075858 A1   3/2008  Koh
2017/0167021 A1   6/2017  Lin et al.

FOREIGN PATENT DOCUMENTS

KR      101426432 B1   8/2014
KR      20150098454 A  8/2015

* cited by examiner

MULTI-STATION CHAMBER LID WITH PRECISE TEMPERATURE AND FLOW CONTROL

CROSS-REFERENCE TO RELATED APPLICATIONS

This application claims priority to U.S. Provisional Application No. 62/739,194, filed Sep. 29, 2018, the entire disclosure of which is hereby incorporated by reference herein.

TECHNICAL FIELD

Embodiments of the disclosure are directed to process chamber lids. In particular, embodiments of the disclosure relate to chamber lids for multi-station processing of semiconductor substrate wafers.

BACKGROUND

Film deposition methods utilized in semiconductor manufacturing are highly temperature dependent. Variations in temperature across a substrate surface can lead to non-uniform deposition and ultimately device failure and/or decreased throughput. Therefore, there is a need for uniform temperature control across a substrate surface during processing. This need is also present for wafers which are transferred from one processing environment to another.

Additionally, certain processes outgas species from the substrate surface during processing. These species may deteriorate the quality of the substrate surface if allowed to react therewith. Therefore, there is a need for purge systems able to remove outgassed species from a substrate surface quickly and efficiently before the species are able to react with the substrate surface.

Recent advances in processing chamber design comprise multiple wafer processing environments within a single processing chamber. In this type of processing environment, wafers are moved between adjacent process stations within the chamber. Each process station is configured to perform some aspect of the wafer processing. Tight temperature control of 0.5° C. on the wafer is needed for uniform and reproducible processing. The wafer spends up to 50% of the total cycle time traveling below the lid during transfer between stations. The wafer temperature can vary during movement between process stations; affecting process uniformity or throughput by requiring additional time for temperature equilibration. Therefore, there is a need in the art for temperature control and purge systems able to isolate multiple processing environments within a single processing chamber.

SUMMARY

One or more embodiments are directed to processing chamber lids comprising a lid body with a top surface and bottom surface. A plurality of station openings extend from the top surface through the lid body to the bottom surface. Each opening has an outer peripheral edge. A station separation purge channel extends around the outer peripheral edge of each of the plurality of station openings. The station separation purge channel has a plurality of apertures extending from the station separation purge channel to the bottom surface of the lid body. The plurality of apertures is spaced around the plurality of station openings. A plurality of angular purge channels extends from a center portion of the lid body to an outer peripheral edge portion of the lid body between adjacent station openings. Each of the angular purge channels comprises a plurality of spaced apertures extending from the angular purge channel to the bottom surface of the lid body.

Additional embodiments of the disclosure are directed to processing methods. A purge gas is flowed through a station separation purge channel extending around an outer peripheral edge of a plurality of station openings. The station separation purge channel has a plurality of apertures extending from the station separation purge channel to a bottom surface of a lid body to allow a flow of purge gas into an interior volume of a processing chamber around process stations. A purge gas is flowed through a plurality of angular purge channels extending from a center portion of the lid body to an outer peripheral edge portion of the lid body between adjacent station openings. Each of the angular purge channels comprises a plurality of spaced apertures extending from the angular purge channel to the bottom surface of the lid body to flow the purge gas into the interior volume of the processing chamber between the process stations.

Further embodiments of the disclosure are directed to non-transitory computer readable medium including instructions, that, when executed by a controller of a processing chamber, causes the processing chamber to perform operations of: flowing a purge gas through a station separation purge channel extending around an outer peripheral edge of a plurality of station openings, the station separation purge channel having a plurality of apertures extending from the station separation purge channel to a bottom surface of a lid body into an interior volume of a processing chamber around process stations; and flowing a purge gas through a plurality of angular purge channels extending from a center portion of the lid body to an outer peripheral edge portion of the lid body between adjacent station openings, each of the angular purge channels comprising a plurality of spaced apertures extending from the angular purge channel to the bottom surface of the lid body to flow the purge gas into the interior volume of the processing chamber between the process stations.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Some embodiments of the disclosure are directed to a chamber lid which is thermally controlled to minimize temperature drift of wafers processed thereunder. The chamber lid comprises a plurality of processing regions and a heating element around the circumference of the chamber lid, the heating element surrounding the processing regions. The heating element is capable of maintaining a lid temperature of about 150° C.+/−10° C. and a temperature uniformity of a processed wafer of <0.5° C. In some embodiments, the heating element is configured to maintain a lid temperature in the range of about 75° C. to about 175° C.

One or more embodiments of the disclosure are directed to chamber lids having recursive paths for uniform purge distribution around process stations to effectively separate process stations. In some embodiments, the chamber lid minimizes film deterioration by providing angular purges to carry outgassed particles during wafer transfer. In some embodiments, the chamber lid is heated to a predetermined setpoint to minimize or prevent temperature skew from developing on a wafer. In some embodiments, the recursive flow paths are configured to achieve less than 1% non-uniformity of gas distribution without gas jetting. In some embodiments, the recursive flow paths provide effective gas separation and uniform distribution.

Some embodiments of the disclosure are directed to a chamber lid which separates the process flows of a plurality of process regions. The chamber lid comprises circular purge channels which surround each process region, the purge channels connected to a central purge feed. Some embodiments effectively prevent cross-talk between process regions such that the mass fraction of a reactant in a neighboring processing region is less than 1e-6 over a range of gap spacings. In some embodiments, when a reactant is used in one station, the concentration of that reactant in the neighboring (adjacent) station is less than 1 ppm or 100 ppb or 10 ppb or 1 ppb.

Further embodiments of the disclosure are directed to a chamber lid which removes outgassed species between processing regions. The chamber lid comprises angular purge channels between the process regions. As wafers move between process regions, the angular purge channels remove outgassed species from the substrate surface. In some embodiments, the angular purge channels are able to remove outgassed species in less than 0.5 s to enable shorter cycle times.

Some embodiments of the disclosure are directed to processing chambers having a plurality of process stations. The process stations can have the same or different thermal environments so that movement between the process stations can have transient effects on processes. In some embodiments, the processing chamber has in the range of about two to about eight processing stations.

Some embodiments of the disclosure advantageously provide apparatus and methods to constrain precursors to a particular process station and prevent or minimize cross-talk. Some embodiments advantageously provide apparatus and methods to minimize the total purge gas flow by optimizing purge gas flow paths for effectiveness.

Precursor diffusion between stations increases with higher lid-top plate gap distances and with certain precursors (e.g., $NH_3$). One or more embodiments advantageously provide apparatus and methods to restrict precursor diffusion.

Figure 1:
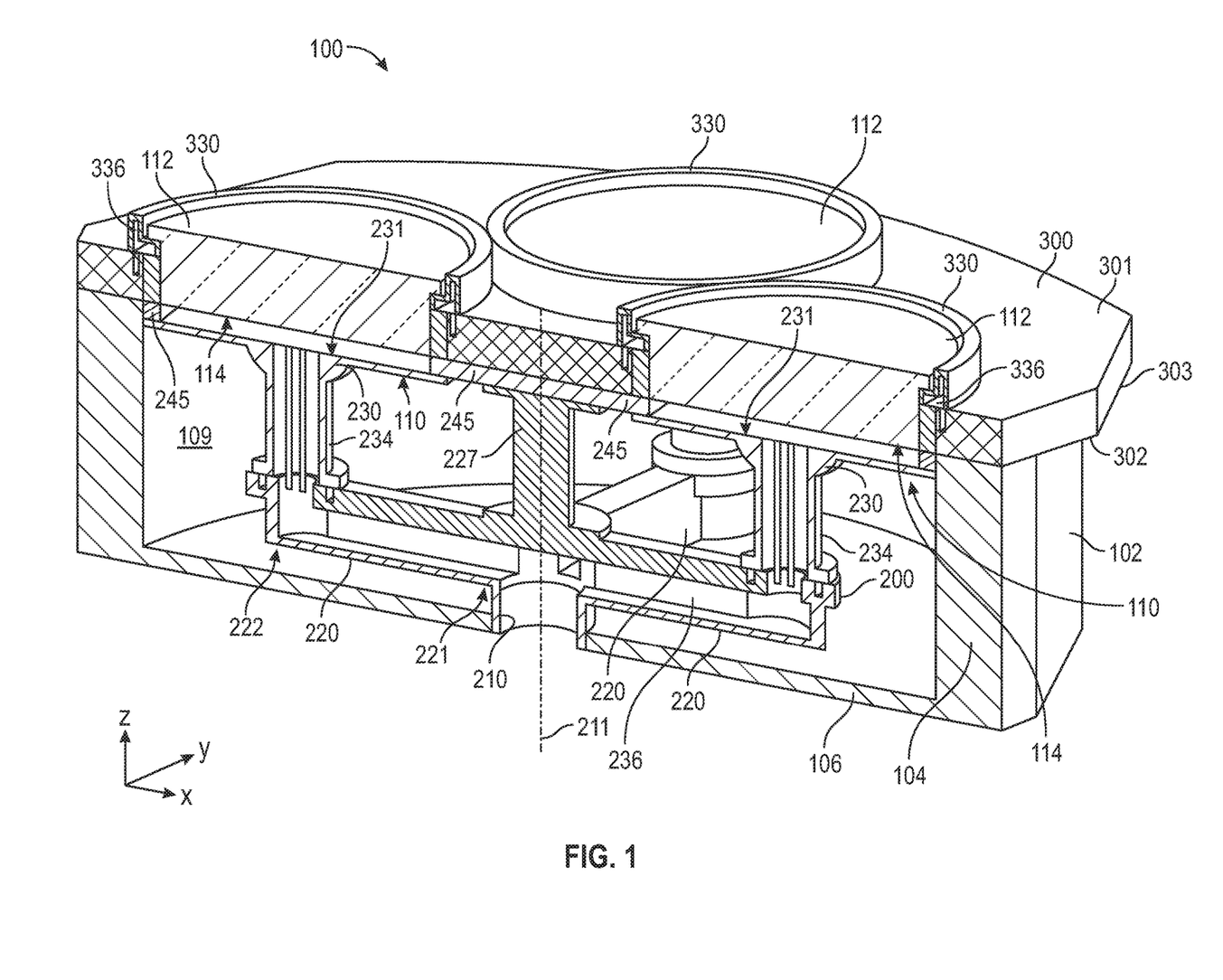
FIG. 1 shows an cross-sectional isometric view of a processing chamber in accordance with one or more embodiment of the disclosure.
Figure 2:
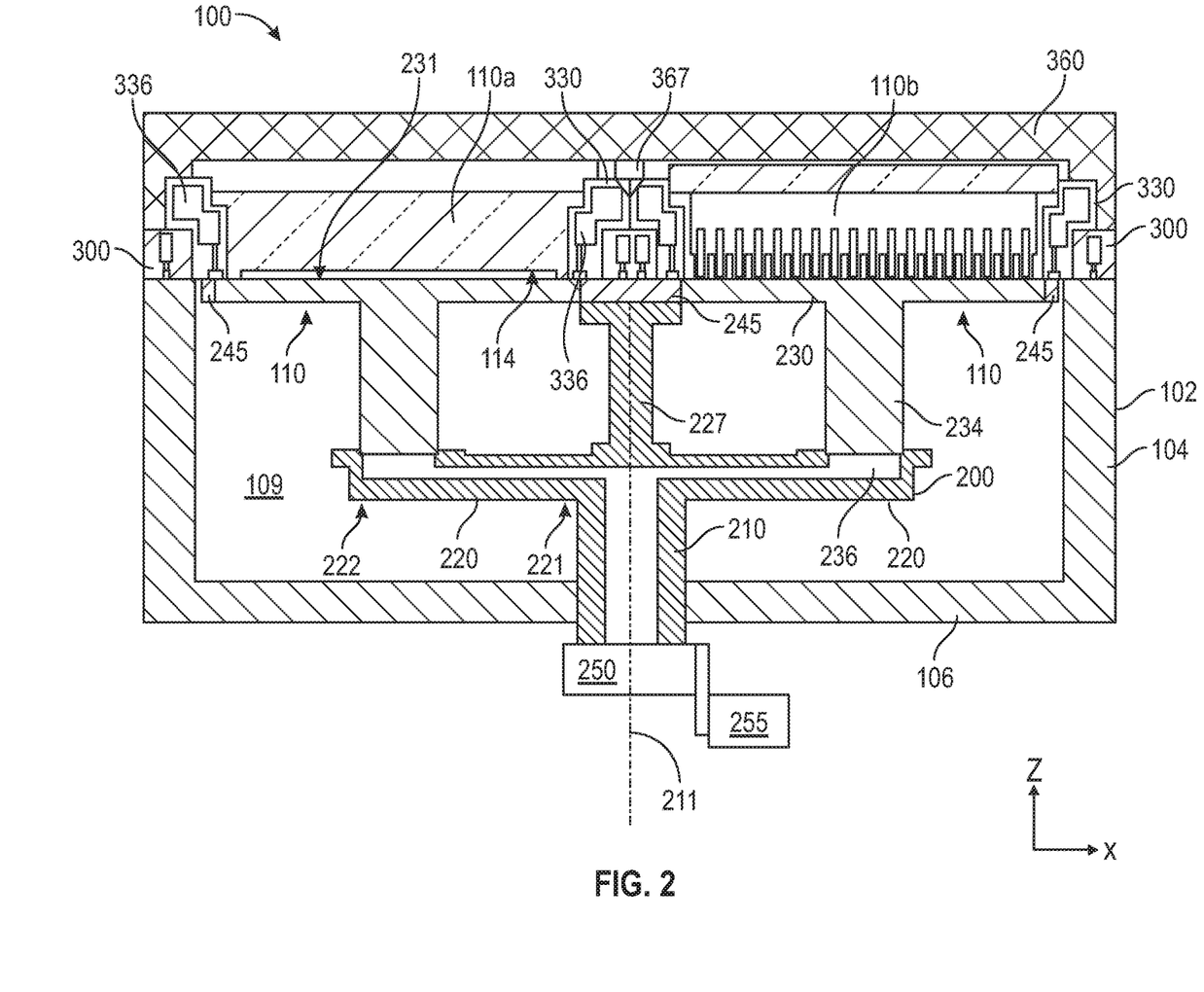
FIG. 2 shows a cross-sectional view of a processing chamber in accordance with one or more embodiment of the disclosure.

FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. Accordingly, some embodiments of the disclosure are directed to processing chambers 100 that incorporate a support assembly 200 and top plate 300.

The processing chamber 100 has a housing 102 with walls 104 and a bottom 106. The housing 102 along with the top plate 300 define an interior volume 109, also referred to as a processing volume.

The processing chamber 100 includes a plurality of process stations 110. The process stations 110 are located in the interior volume 109 of the housing 102 and are positioned in a circular arrangement around the rotational axis 211 of the support assembly 200. The process stations 110 are spatially arranged around the interior volume 109 of the processing chamber 100. Each process station 110 comprises a gas injector 112 having a front face 114. In some embodiments, the front faces 114 of each of the gas injectors 112 are substantially coplanar. In some embodiments, the front faces 114 of the gas injectors 112 are non-coplanar, forming a different gap between the front face 114 and a support surface 231. The process stations 110 are defined as a region in which processing can occur. For example, a process station 110 can be defined by the support surface 231 of the heaters 230 and the front face 114 of the gas injectors 112.

The process stations 110 can be configured to perform any suitable process and provide any suitable process conditions. The type of gas injector 112 used will depend on, for example, the type of process being performed and the type of showerhead or gas injector. For example, a process station 110 configured to operate as an atomic layer deposition apparatus may have a showerhead or vortex type gas injector. Whereas, a process station 110 configured to operate as a plasma station may have one or more electrode and/or grounded plate configuration to generate a plasma while allowing a plasma gas to flow toward the wafer. The embodiment illustrated in FIG. 2 has a different type of process station 110 on the left side (process station 110a) of the drawing than on the right side (process station 110b) of the drawing. Suitable process stations 110 include, but are not limited to, thermal processing stations, microwave plasma, three-electrode CCP, ICP, parallel plate CCP, UV exposure, laser processing, pumping chambers, annealing stations and metrology stations.

The support assembly 200 includes a rotatable center base 210. The rotatable center base 210 can have a symmetrical or asymmetrical shape and defines a rotational axis 211. The rotational axis 211 extends in a first direction which may be referred to as the vertical direction or along the z-axis; however, it will be understood that the use of the term "vertical" in this manner is not limited to a direction relative to the pull of gravity.

In some embodiments, the support assembly 200 includes at least two support arms 220 connected to and extending from the center base 210. The support arms 220 have an inner end 221 and an outer end 222. The inner end 221 is in contact with the center base 210 so that when the center base 210 rotates around the rotational axis 211, the support arms 220 rotate as well. The support arms 220 can be connected to the center base 210 at the inner end 221 by fasteners (e.g., bolts) or by being integrally formed with the center base 210.

The number of support arms 220 in the support assembly 200 can vary. In some embodiments, there are at least two, three, four, five, six, seven or eight support arms 220. In some embodiments, there are three support arms 220. In some embodiments, there are four support arms 220. In some embodiments, there is the same number of support arms 220 as process stations 110.

The support arms 220 can be arranged symmetrically around the center base 210. For example, in a support assembly 200 with four support arms 220, each of the support arms 220 are positioned at 90° intervals around the center base 210. In a support assembly 200 with three support arms 220, the support arms 220 are positioned at 120° intervals around the center base 210. Stated differently, in embodiments with four support arms 220, the support arms are arrange to provide four-fold symmetry around the rotation axis 211. In some embodiments, the support assembly 200 has n-number of support arms 220 and the n-number of support arms 220 are arranged to provide n-fold symmetry around the rotation axis 211.

A heater 230 is positioned at the outer end 222 of the support arms 220. In some embodiments, each support arm 220 has a heater 230. The center of the heaters 230 are located at a distance from the rotational axis 211 so that upon rotation of the center base 210 the heaters 230 move in a circular path.

The heaters 230 have a support surface 231 which can support a wafer. In some embodiments, the heater 230 support surfaces 231 are substantially coplanar. As used in this manner, "substantially coplanar" means that the planes formed by the individual support surfaces 231 are within ±5°, ±4°, ±3°, ±2° or ±1° of the planes formed by the other support surfaces 231.

In some embodiments, the heaters 230 are positioned directly on the outer end 222 of the support arms 220. In some embodiments, as illustrated in the drawings, the heaters 230 are elevated above the outer end 222 of the support arms 220 by a heater standoff 234. The heater standoffs 234 can be any size and length to increase the height of the heaters 230.

In some embodiments, a channel 236 is formed in one or more of the center base 210, the support arms 220 and/or the heater standoffs 234. The channel 236 can be used to route electrical connections or to provide a gas flow.

The heaters can be any suitable type of heater known to the skilled artisan. In some embodiments, the heater is a resistive heater with one or more heating elements within a heater body. The heaters 230 of some embodiments include additional components. For example, the heaters may comprise an electrostatic chuck. The electrostatic chuck can include various wires and electrodes so that a wafer positioned on the heater support surface 231 can be held in place while the heater is moved. This allows a wafer to be chucked onto a heater at the beginning of a process and remain in that same position on that same heater while moving to different process regions. In some embodiments, the wires and electrodes are routed through the channels 236 in the support arms 220.

In some embodiments, a support plate 245 is supported by support post 227. The support post 227 may have utility in preventing sagging of the center of the support plate 245 when a single component platform is used. In some embodiments, the support post 227 is the primary support for the support plate 245

Referring to FIGS. 3-9, some embodiments of the disclosure are directed to top plates 300 for multi-station processing chambers. The top plate 300 comprises a lid body 307 having a top surface 301 and a bottom surface 302 defining a thickness of the lid, and one or more edges 303. The top plate 300 includes at least one opening 310 extending through the thickness thereof. The openings 310 are sized to permit the addition of a gas injector 112 (see FIG. 1) which can form a process station 110. In some embodiments, there are in the range of 2 to 6 station openings 310. In some embodiments, each of the station openings 310 has about the same diameter. As used in this manner, the term "about the same diameter" means that each of the diameters is within ±1% or 0.5% relative to the average diameter. In some embodiments, there are at least two different diameter openings 310.

Figure 3:
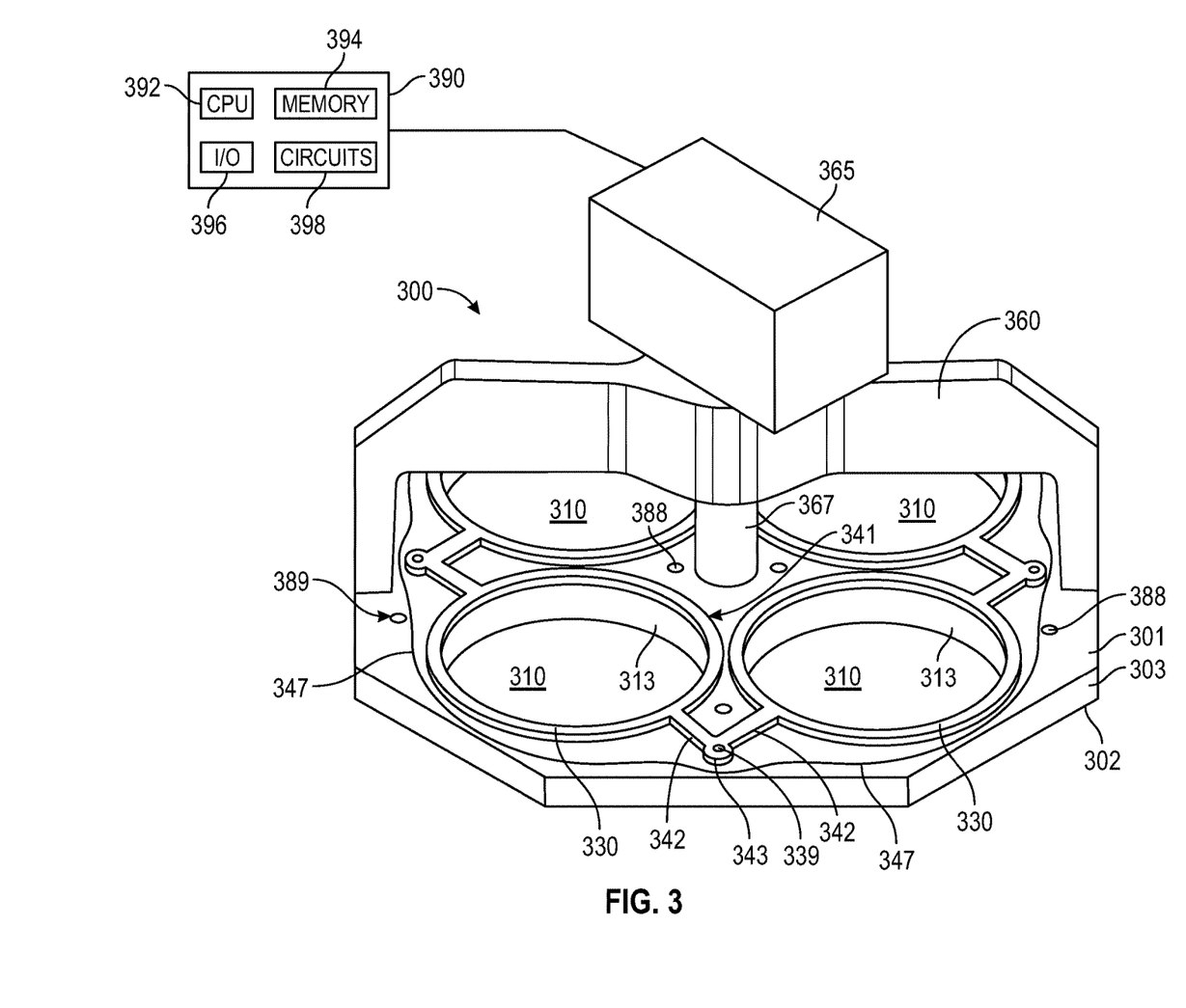
FIG. 3 illustrates a top plate for a processing chamber according to one or more embodiment of the disclosure.

The openings 310 in the top plate 300 can be uniformly sized or have different sizes. In some embodiments, a station separation purge channel 329 surrounds each of the openings 310. The station separation purge channel 329 can be any suitable shape or size. In some embodiments, the station separation purge channel 329 is a groove formed in the top plate 300 with an insert to form a sealed space within. In the illustrated embodiments, the station separation purge channel 329 includes a pump/purge insert 330 positioned is in fluid communication with a purge gas source (not shown) to provide a positive flow of purge gas to prevent leakage of processing gases from the processing chamber. Reference to features of the station separation purge channel 329 includes embodiments in which there is a pump/purge insert 330. For example, where the station separation purge channel 329 comprises inlet 339, the skilled artisan will recognize that the inlet 339 can be located within the pump/purge insert 330 which will, in turn, be located within the station separation purge channel 329.

Figure 4:
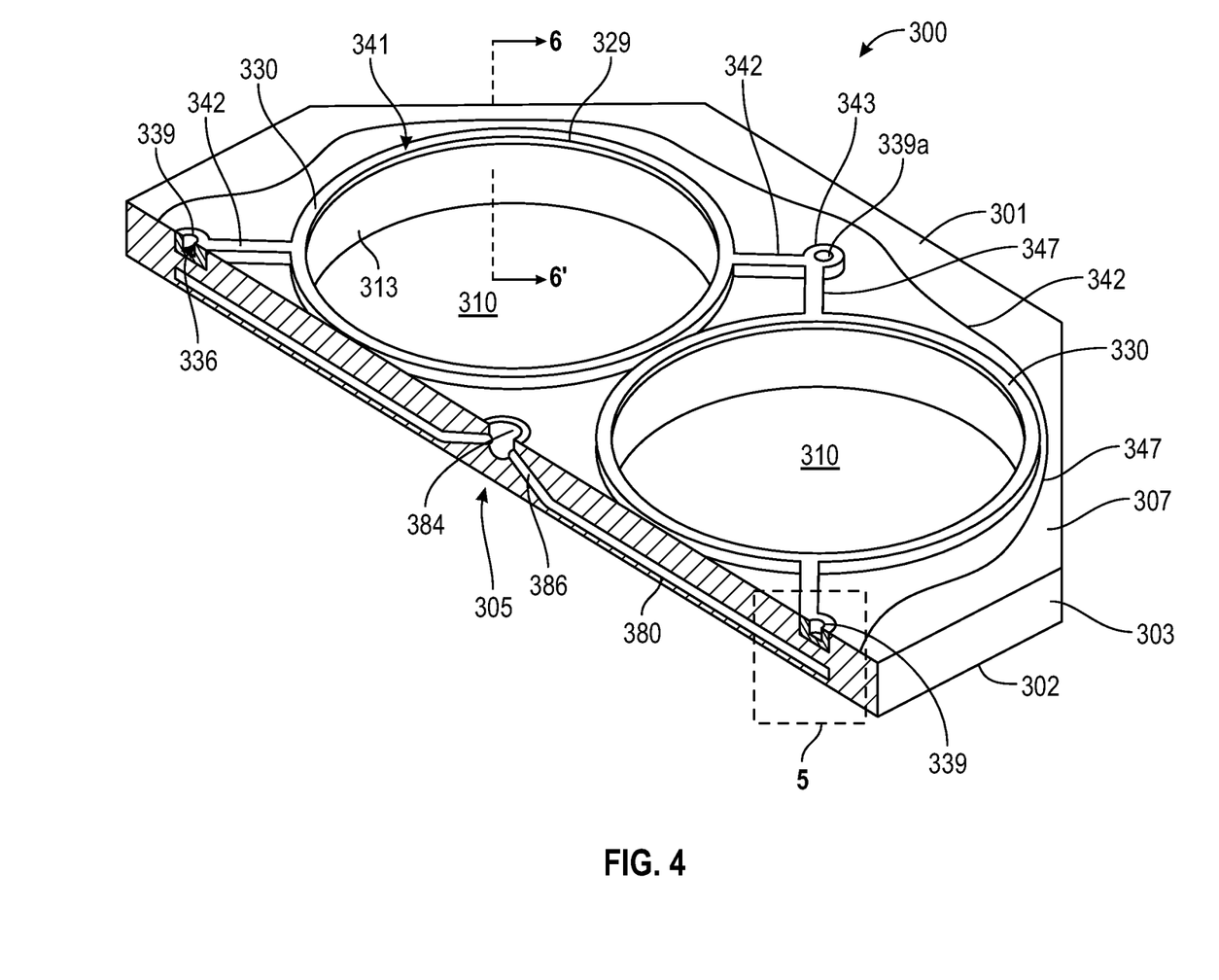
FIG. 4 illustrates a partial cross-sectional parallel projection of a processing chamber lid according to one or more embodiments of the disclosure

In some embodiments, the station separation purge channel 329 comprises a plurality of circular portions 341 around the station openings 310, as shown in FIGS. 3 and 4. In some embodiments, the each of the plurality of circular portions 341 of the station separation purge channel 329 is connected to an adjacent circular portion 341 through one or more connector segment 342. As shown in the embodiment of FIGS. 3 and 4, each of the circular portions 341 is connected to two adjacent circular portions 341 through two connector segments 342. The two connector segments 342 join at hub 343 in which inlet 339 is located.

In some embodiments, the diameters of the circular portions 341 of the station separation purge channels 329 are independent of the diameter of the station openings 310. The diameters of the circular portions 341 are measured between the inner-most sidewall 335 of the channel relative to the outer peripheral wall 313 of the opening 310. Stated differently, the diameters of the circular portions 341 are measured between the walls closest to the opening 310 that the particular circular portion 341 surrounds. In some embodiments, each of the circular portions 341 has about the same diameter. In some embodiments, each of the circular portions 341 has a diameter dependent upon the diameter of the station openings 310. For example, the diameter of each of the circular portions is greater than the diameter of each of the openings 310 by an amount D (see FIG. 6) in the range of about 0.5 mm to about 50 mm or in the range of about 1 mm to about 25 mm.

Figure 5:
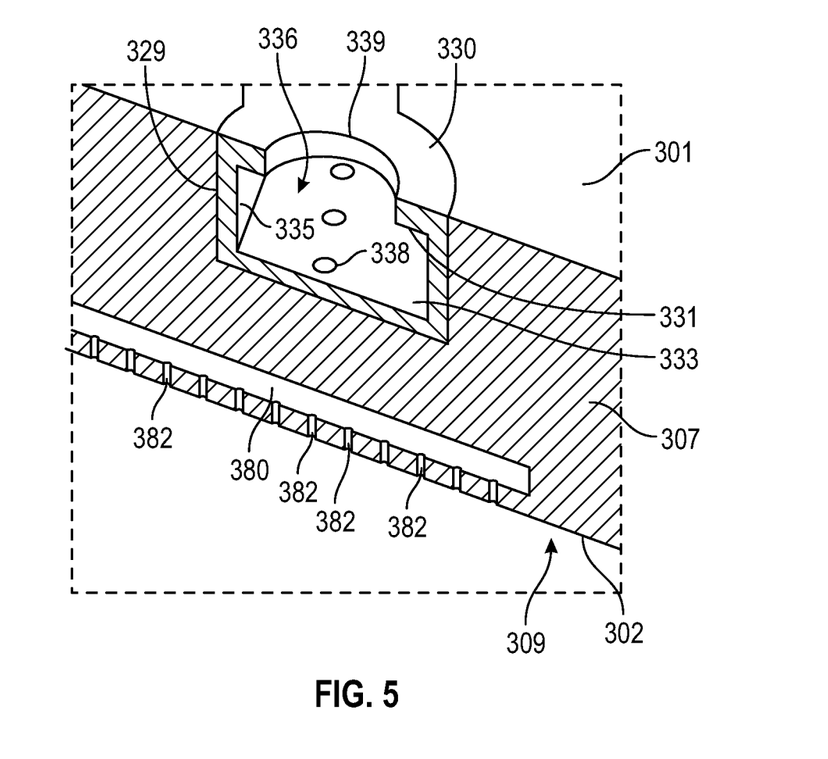
FIG. 5 illustrates an expanded view of region 5 of FIG. 4.
Figure 6:
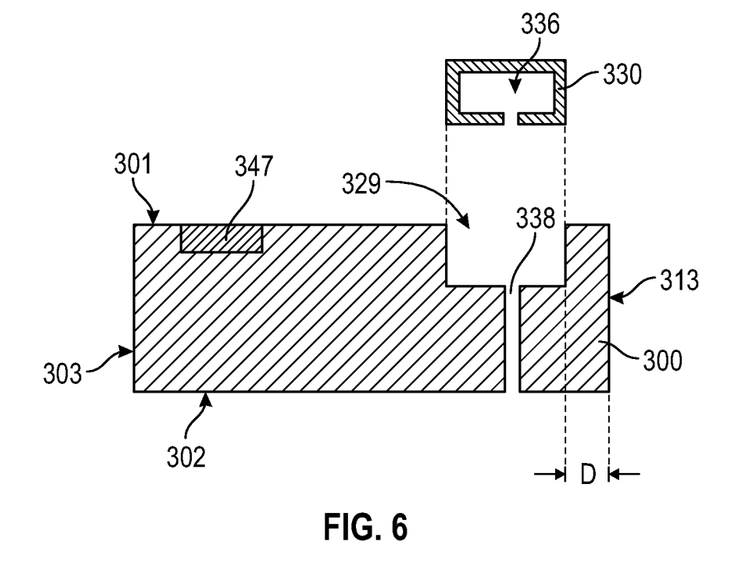
FIG. 6 illustrates a cross-sectional view of FIG. 4 taken along line 6-6'.

FIG. 4 shows a cross-sectional view of a top plate 300 in accordance with one or more embodiment of the disclosure. FIG. 5 shows an expanded view of region 5 illustrating a portion of the pump/purge insert 330. FIG. 6 shows a cross-sectional view of a portion of the top plate 300 of FIG. 4 taken along line 6-6' with the pump/purge insert 330 separate from the station separation purge channel 329. In the illustrated embodiment, the pump/purge insert 330 includes a gas plenum 336 with at least one opening 338 in the bottom 333 of the pump/purge insert 330. The gas plenum 336 has an inlet 339 near the top 331 or sidewall 335 of the pump/purge insert 330.

In some embodiments, the plenum 336 can be charged through inlet 339 with a purge or inert gas which can pass through the opening 338 in the bottom 333 of the pump/purge insert 330. The gas flow through the opening 338 can help create a gas curtain type barrier to prevent leakage of process gases from the interior of the processing chamber.

In some embodiments, the plenum 336 is connected to or in fluid communication with a vacuum source. In such an embodiment, gases flow through the opening 338 in the bottom 333 of the pump/purge insert 330 into the plenum 336. The gases can be evacuated from the plenum to exhaust. Such an arrangement can be used to evacuate gases from the process station 110 during use. In some embodiments, as shown in FIG. 4, the pump/purge insert 330 has at least one inlet 339 and at least one outlet 339a. In some embodiments, a purge gas can be flowed into the plenum 336 through inlet 339 and switched to a vacuum source connected to outlet 339a to remove gases from the plenum 336.

In some embodiments, each of the openings is used as an inlet. In some embodiments, each of the openings is used as an outlet. In some embodiments, each of the openings is connected to a switchable gas source and vacuum source to allow the gas source or vacuum source to be connected to the plenum 336. In some embodiments, there are an equal number of inlets 339 in the station separation purge channel as there are station openings 310. In some embodiments, each inlet 339 in the station separation purge channel connects to two adjacent circular portions of the station separate purge channel.

Figure 7:
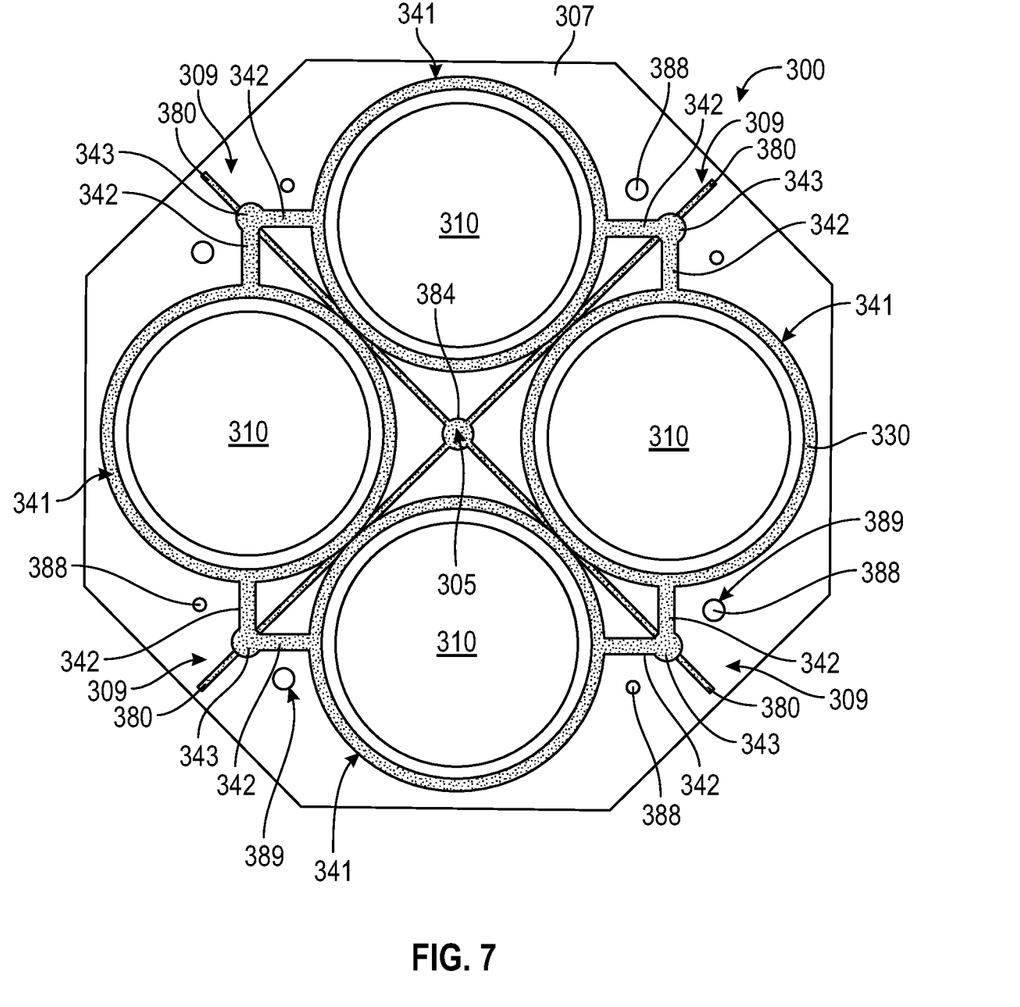
FIG. 7 illustrates a schematic view of a processing chamber lid according to one or more embodiments of the disclosure.
Figure 8:
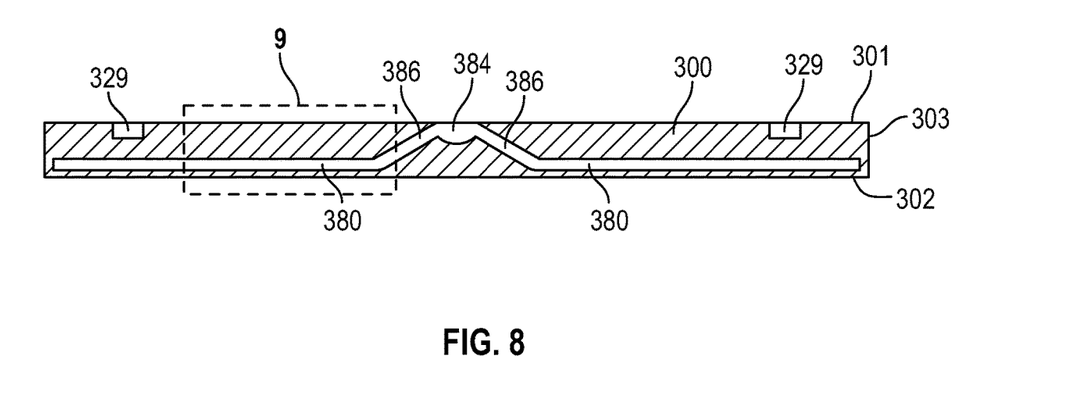
FIG. 8 illustrates a cross-sectional view of a processing chamber lid according to one or more embodiments of the disclosure.
Figure 9:
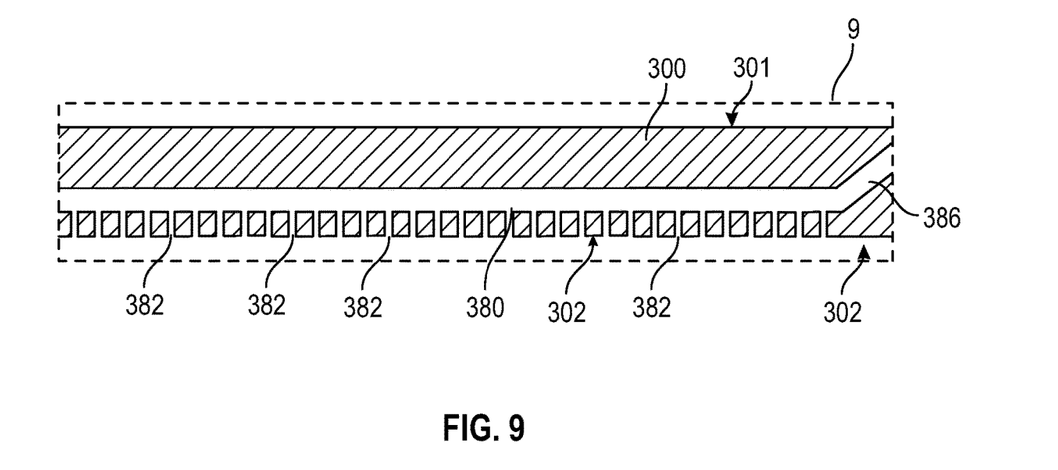
FIG. 9 illustrates a region 9 of the cross-sectional view of FIG. 8.

As shown in FIGS. 4-5 and 7-9, some embodiments of the top plate 300 include a plurality of angular purge channels 380 extending from a center portion 305 of the lid body 307 to an outer peripheral edge portion 309 of the lid body 307. The angular purge channels 380 extend between adjacent station openings 310. FIG. 4 shows a cross-sectional isometric view of an embodiment of the top plate 300 taken through the center portion 305 of the lid body 307 along two of the angular purge channels 380. FIG. 5 shows an expanded view of region 5 of FIG. 4 showing a portion of the angular purge channels 380 near the outer peripheral edge portion 309 of the lid body 307. FIG. 7 illustrates a schematic representation of an embodiment of the top plate 300 showing the various gas passages. The skilled artisan will recognize that all of the illustrated gas passages are not visible in a top down view of the top plate 300 and that the illustrations shows the passages in a wireframe view. FIG. 8 shows the cross-section of FIG. 4 without the partial isometric view. FIG. 9 shows an expanded portion of region 9 of FIG. 8.

Each of the angular purge channels 380 comprise a plurality of spaced apertures 382. The spaced apertures extend from the angular purge channel 380 to the bottom surface 302 of the lid body 307. While the shape of the spaced apertures 382 is illustrated as cylindrical, the skilled artisan will recognize that other shapes are within the scope of the disclosure. For example, the apertures of some embodiments has an upper portion connected to the angular purge channel 380 with a wider diameter than a lower portion connected to the bottom surface 302. The transition from the wider diameter to the narrower diameter can be linear, gradient or stepped.

In some embodiments, each of the angular purge channels 380 is connected to separate inlets. In some embodiments, all of the angular purge channels 380 are connected to a single inlet 384 located in the center portion 305 of the lid body 307. In some embodiments, the inlet 384 is located adjacent the top surface 301 of the lid body 307. In some embodiments, the inlet 384 has a spherically shaped portion adjacent the top surface 301 of the lid body 307. A sloped portion 386 angles from the spherically shaped portion adjacent the top surface 301 to the angular purge channel 380 adjacent the bottom surface 302 of the lid body 307. The sloped portion 386 provides fluid communication between the spherically shaped portion and the angular purge channels 380.

Referring back to FIGS. 2 and 3, some embodiments of the top plate 300 include a lid support beam 360 that passes over a center portion 305 of the top plate 300. The lid support beam 360 can be connected to the top plate 300 near the center using connector 367. The connector 367 can be used to apply force orthogonal to the top plate 300 to compensate for bowing in the top plate 300 as a result of pressure differentials or due to the weight of the top plate 300. In some embodiments, the lid support beam 360 and connector 367 are capable of compensating for deflection of up to or equal to about 5 mm, 4 mm, 3 mm, 2 mm or 1.5 mm at the center of a top plate having a width of about 1.5 m and a thickness of up to or equal to about 100 mm. In some embodiments, the lid support beam is configured to provide deformation compensation for the lid body to compensate for deflection up to about 5 mm.

Some embodiments include a motor/actuator 365 connected to the lid support beam 360. The motor 365 or actuator is connected by any suitable connection type to connector 367 and can cause a change in directional force applied to the top plate 300. The motor 365 or actuator can be supported on the lid support beam 360. The lid support beam 360 illustrated is in contact with the edges of the top plate 300 at two locations. However, the skilled artisan will recognize that there can be one connection location or more than two connection locations. In some embodiments, the lid support beam comprises a motor/actuator in communication with a controller 390 configured to provide top surface or bottom surface directed force on a center portion of the lid. The top surface or bottom surface directed force refers to the connection stress point of the connector 367 relative to the lid body 307.

Referring back to FIG. 2, the support assembly 200 of some embodiments includes at least one motor 250. The at least one motor 250 is connected to the center base 210 and is configured to rotate the support assembly 200 around the rotational axis 211. In some embodiments, the at least one motor is configured to move the center base 210 in a direction along the rotational axis 211. For example, in FIG. 2, motor 255 is connected to motor 250 and can move the support assembly 200 along the rotational axis 211. Stated differently, the motor 255 illustrated can move the support assembly 200 along the z-axis, vertically or orthogonally to the movement caused by motor 250. In some embodiments, as illustrated, there is a first motor 250 to rotate the support assembly 200 around the rotational axis 211 and a second motor 255 to move the support assembly 200 along the rotational axis 211 (i.e., along the z-axis or vertically).

As shown in FIGS. 3 and 7, some embodiments of the top plate 300 comprise one or more sensors 388. The one or more sensors 388 of some embodiments are positioned in openings 389 in the top plate 300. The sensors 388 can be any suitable sensors known to the skilled artisan that can be used with the top plate 300 and process chamber 100. In some embodiments, the sensors 388 comprise one or more of temperature sensors (e.g., pyrometers), distance sensors, level finders or metrology sensors (e.g., near-IR).

Referring to FIGS. 3 and 6, some embodiments include a heater 347. In some embodiments, the heater 347 comprises a heater cable that extends around the outer periphery of the top plate 300. The heater 347 can be located at any distance within the body 307. For example, the heater 347 can be located within the thickness of the body 307 or on the top surface 301.

As shown in FIG. 3, some embodiments include at least one controller 390. The controller 390 is coupled to one or more of the motor/actuator 365, heater 347, purge gas source (not shown), vacuum source (not shown) or sensors 388. The controller 950 may be one of any form of general-purpose computer processor, microcontroller, microprocessor, etc., that can be used in an industrial setting for controlling various components.

The at least one controller 390 can have a processor 392, a memory 394 coupled to the processor 392, input/output devices 396 coupled to the processor 392, and support circuits 398 to communication between the different electronic components. The memory 394 can include one or more of transitory memory (e.g., random access memory) and non-transitory memory (e.g., storage).

The memory 394, or computer-readable medium, of the processor may be one or more of readily available memory such as random access memory (RAM), read-only memory (ROM), floppy disk, hard disk, or any other form of digital storage, local or remote. The memory 394 can retain an instruction set that is operable by the processor 392 to control parameters and components of the processing chamber 100. The support circuits 398 are coupled to the processor 392 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 390 has one or more configurations to execute individual processes or sub-processes. The controller 390 can be connected to and configured to operate intermediate components to perform the functions of the methods. For example, the controller 390 can be connected to and configured to control one or more of gas valves, actuators, motors, slit valves, vacuum control, etc.

The controller 390 of some embodiments has one or more configurations selected from: a configuration to power a heater; a configuration to read temperature from temperature sensors; a configuration to provide power to the heater based on temperatures read from temperature sensors; a configuration to operate a motor/actuator to level the chamber lid; a configuration to provide a flow of gas to the station separation purge channel or a configuration to provide a flow of gas to the plurality of angular purge channels.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing chamber lid comprising:
   a lid body having a top surface and a bottom surface;
   a plurality of station openings in the range of 2 to 6, the station openings extending from the top surface through the lid body to the bottom surface, each opening having an outer peripheral edge, the station openings having at least two different diameters;
   a station separation purge channel extending around the outer peripheral edge of each of the plurality of station openings, the station separation purge channel having a plurality of apertures extending from the station separation purge channel to the bottom surface of the lid body, the plurality of apertures spaced around the plurality of station openings; and
   a plurality of angular purge channels extending from a center portion of the lid body to an outer peripheral edge portion of the lid body between adjacent station openings, each of the angular purge channels comprising a plurality of spaced apertures extending from the angular purge channel to the bottom surface of the lid body.

2. The processing chamber lid of claim 1, wherein the station separation purge channel comprising a plurality of circular portions around the station openings.

3. The processing chamber lid of claim 1, wherein the station separation purge channel comprises a plurality of inlets.

4. The processing chamber lid of claim 1, wherein the plurality of angular purge channels connects to a single inlet located in a center portion of the lid body.

5. The processing chamber lid of claim 1, further comprising a lid support beam extending across a width of the lid body, the lid support beam connected to a center portion of the lid body.

6. The processing chamber lid of claim 1, further comprising one or more sensors.

7. The processing chamber lid of claim 1, wherein the bottom surface is coplanar within ±2 mm.

8. The processing chamber lid of claim 2, wherein the circular portions have the same diameter around all of the station openings.

9. The processing chamber lid of claim 3, wherein there are an equal number of inlets in the station separation purge channel as station openings.

10. The processing chamber lid of claim 9, wherein each inlet in the station separation purge channel connects to two adjacent circular portions of the station separation purge channel.

11. The processing chamber lid of claim 5, wherein the lid support beam is configured to provide deformation compensation for the lid body to compensate for deflection up to about 5 mm.

12. The processing chamber lid of claim 11, wherein the lid support beam further comprises a motor/actuator in communication with a controller, the controller configured to provide top surface or bottom surface directed force on a center portion of the lid body.

13. The processing chamber lid of claim 6, wherein the one or more sensors comprise one or more of pyrometers or level finders.

14. A processing method comprising:
   flowing a purge gas through a station separation purge channel extending around an outer peripheral edge of a plurality of station openings in the range of 2 to 6, the plurality of station openings having at least two different diameters, the station separation purge channel having a plurality of apertures extending from the station separation purge channel to a bottom surface of a lid body into an interior volume of a processing chamber around process stations; and
   flowing a purge gas through a plurality of angular purge channels extending from a center portion of the lid body to an outer peripheral edge portion of the lid body between adjacent station openings, each of the angular purge channels comprising a plurality of spaced apertures extending from the angular purge channel to the bottom surface of the lid body to flow the purge gas into the interior volume of the processing chamber between the process stations.

15. The processing method of claim 14, further comprising controlling a temperature of the lid body.

16. The processing method of claim 14, further comprising compensating for deflection of the lid body using a lid support beam configured to provide deformation compensation up to about 5 mm of deflection.

17. A non-transitory computer readable medium including instructions, that, when executed by a controller of a processing chamber, causes the processing chamber to perform operations of:
   flowing a purge gas through a station separation purge channel extending around an outer peripheral edge of a plurality of station openings in the range of 2 to 6, the plurality of station openings having at least two different diameters, the station separation purge channel having a plurality of apertures extending from the station separation purge channel to a bottom surface of a lid body into an interior volume of a processing chamber around process stations; and
   flowing a purge gas through a plurality of angular purge channels extending from a center portion of the lid body to an outer peripheral edge portion of the lid body between adjacent station openings, each of the angular purge channels comprising a plurality of spaced apertures extending from the angular purge channel to the bottom surface of the lid body to flow the purge gas into the interior volume of the processing chamber between the process stations.

\* \* \* \* \*